(12) United States Patent
Lee et al.

(10) Patent No.: US 9,705,515 B1
(45) Date of Patent: Jul. 11, 2017

(54) DIGITAL PHASE LOCKED LOOP AND METHOD OF DRIVING THE SAME

(71) Applicant: ELECTRONICS AND TELECOMMUNICATIONS RESEARCH INSTITUTE, Daejeon (KR)

(72) Inventors: Ja Yol Lee, Nonsan-si (KR); Min Jae Lee, Gwangju (KR); Cheon Soo Kim, Daejeon (KR); Min Uk Heo, Gwangju (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/273,764

(22) Filed: Sep. 23, 2016

(30) Foreign Application Priority Data

Jan. 11, 2016 (KR) .......................... 10-2016-0003157

(51) Int. Cl.
| | |
|---|---|
| *H03L 7/099* | (2006.01) |
| *H03L 7/18* | (2006.01) |
| *H03L 7/091* | (2006.01) |
| *H03L 7/093* | (2006.01) |
| *H03L 7/085* | (2006.01) |

(52) U.S. Cl.
CPC ............ *H03L 7/0991* (2013.01); *H03L 7/085* (2013.01); *H03L 7/091* (2013.01); *H03L 7/093* (2013.01); *H03L 7/18* (2013.01)

(58) Field of Classification Search
CPC ......... H03L 7/18; H03L 7/091; H03L 7/0991; H03L 7/093; H03L 7/085
USPC ........ 327/150, 156, 158, 159, 166; 375/371, 375/372, 373, 374, 375, 376
See application file for complete search history.

(56) References Cited

U.S. PATENT DOCUMENTS

| | | | |
|---|---|---|---|
| 6,809,598 B1 | 10/2004 | Staszewski et al. | |
| 7,990,191 B2* | 8/2011 | Fujino | .................... H03L 7/085 327/147 |
| 8,130,892 B2* | 3/2012 | Takahashi | ............... H03L 7/085 331/18 |
| 8,432,199 B2 | 4/2013 | Lee et al. | |
| 8,433,018 B2 | 4/2013 | Sidiropoulos et al. | |
| (Continued) | | | |

FOREIGN PATENT DOCUMENTS

| | | |
|---|---|---|
| KR | 10-2012-0027465 A | 3/2012 |
| WO | WO-2010/141909 A1 | 12/2010 |

*Primary Examiner* — John Poos
(74) *Attorney, Agent, or Firm* — Rabin & Berdo, P.C.

(57) ABSTRACT

Provided herein is a digital PLL, which can minimize spurious noise. The digital PLL includes a digital controlled oscillator configured to generate an output oscillation signal in response to a digital code, a phase modulation unit configured to perform phase interpolation on the output oscillation signal in response to a phase control code, a TDC configured to generate an error code using a time difference between a reference clock signal and a modulated clock signal, an error detection unit configured to generate a delay code required to compensate for a phase shift error in response to the phase control code and the error code, a delay unit configured to delay at least one of the reference clock signal and the modulated clock signal and provide a delayed clock signal, and a first decoder configured to control the delay unit in response to the delay code.

18 Claims, 8 Drawing Sheets

(56) References Cited

U.S. PATENT DOCUMENTS

| | | | |
|---|---|---|---|
| 8,816,735 B1* | 8/2014 | Chen | H03L 7/085 327/149 |
| 2003/0099173 A1 | 5/2003 | Park | |
| 2003/0133522 A1* | 7/2003 | Staszewski | H03L 7/085 375/345 |
| 2006/0033582 A1* | 2/2006 | Staszewski | H03L 7/085 331/16 |
| 2008/0205571 A1* | 8/2008 | Muhammad | H04L 27/367 375/376 |
| 2009/0097609 A1* | 4/2009 | Chang | H03L 7/085 375/376 |
| 2009/0267664 A1* | 10/2009 | Uozumi | H03K 5/135 327/158 |
| 2010/0182060 A1* | 7/2010 | Fujino | H03L 7/085 327/159 |
| 2010/0271072 A1 | 10/2010 | Lee et al. | |
| 2011/0148490 A1 | 6/2011 | Lee et al. | |
| 2011/0193601 A1 | 8/2011 | Albasini et al. | |
| 2012/0161834 A1 | 6/2012 | Lee et al. | |
| 2012/0319749 A1 | 12/2012 | Thaller et al. | |
| 2015/0116018 A1* | 4/2015 | Chen | H03L 7/091 327/159 |

\* cited by examiner

DIGITAL PHASE LOCKED LOOP AND METHOD OF DRIVING THE SAME

CROSS-REFERENCE TO RELATED APPLICATION

The present application claims priority to Korean patent application number 10-2016-0003157 filed on Jan. 11, 2016, the entire disclosure of which is incorporated herein in its entirety by reference.

BACKGROUND

Field of Invention

Various embodiments of the present disclosure relate to a digital phase locked loop (PLL) and a method of driving the digital PLL, and more particularly, to a digital PLL and a method of driving the digital PLL, which can minimize spurious noise.

Description of Related Art

A Charge pump phase locked loop (hereinafter referred to as "PLL") has been chiefly used so as to implement a radio frequency (RF) synthesizer for multi-band mobile communication. Such a charge pump PLL is implemented as an analog circuit.

When a charge pump PLL is implemented as an analog circuit, a separate analog/RF library is required in addition to a design library, which is provided by a standard digital CMOS manufacturing process, due to the signal characteristics of the analog circuit. Therefore, it is difficult to integrate the charge pump PLL, implemented as an analog circuit, with a digital baseband signal processing block that uses a digital CMOS manufacturing process.

Further, with the development of recent manufacturing process technology, a nanometer scale digital CMOS manufacturing process has been developed, and thus a digital baseband signal processing block has been developed using a nanoscale digital CMOS manufacturing process.

Meanwhile, a digital circuit is hardly re-designed and may be implemented to be easily adapted to a manufacturing process technology. However, an analog circuit must be re-designed whenever manufacturing process technology is changed. Further, as CMOS manufacturing process technology is developed to nanoscale technology, an operating voltage is decreased, and thus it is difficult to apply an analog circuit to CMOS manufacturing technology.

Therefore, research into and development of technology for implementing an analog PLL as a digital PLL has been actively conducted. However, a digital PLL includes spurious noise, by which speech quality is deteriorated.

SUMMARY

Various embodiments of the present disclosure are directed to a digital PLL and a method of driving the digital PLL, which can minimize spurious noise by compensating for errors in interpolated phases.

Furthermore, various embodiments of the present disclosure are directed to a digital PLL and a method of driving the digital PLL, which can correct phase shift errors in all phases using information about errors in some phases.

One embodiment of the present disclosure provides a digital phase locked loop (PLL), including a digital controlled oscillator configured to generate an output oscillation signal in response to a digital code, a phase modulation unit configured to perform phase interpolation on the output oscillation signal in response to a phase control code from a phase control unit, a time to digital converter (TDC) configured to generate an error code using a time difference between a reference clock signal and a modulated clock signal outputted from the phase modulation unit, an error detection unit configured to generate a delay code required to compensate for a phase shift error occurring in the phase interpolation in response to the phase control code and the error code, a delay unit configured to delay at least one of the reference clock signal and the modulated clock signal and provide a delayed clock signal to the TDC, and a first decoder configured to control the delay unit in response to the delay code.

The phase modulation unit may include a first frequency divider configured to generate, using the output oscillation signal, a first clock signal (I) having a phase of 0°, a second clock signal (Q) having a phase of 90°, a third clock signal (IB) having a phase of 180°, and a fourth clock signal (QB) having a phase of 270°, and a phase interpolator configured to generate first interpolated clock signals, second interpolated clock signals, third interpolated clock signals, and fourth interpolated clock signals by performing phase interpolation between the first clock signal (I) to the fourth clock signal (QB).

The phase interpolator may output the first clock signal (I), the second clock signal (Q), the third clock signal (IB), the fourth clock signal (QB), one of the first interpolated clock signals, one of the second interpolated clock signals, one of the third interpolated clock signals, or one of the fourth interpolated clock signals, as the modulated clock signal, in response to the phase control code.

In an embodiment, the phase modulation unit may further include a second frequency divider disposed between the phase interpolator and the delay unit.

In an embodiment, the first frequency divider is a ½ frequency divider.

In an embodiment, the first interpolated clock signals may be generated by performing phase interpolation between the first clock signal (I) and the second clock signal (Q), the second interpolated clock signals may be generated by performing phase interpolation between the second clock signal (Q) and the third clock signal (TB), the third interpolated clock signals may be generated by performing phase interpolation between the third clock signal (TB) and the fourth clock signal (QB), and the fourth interpolated clock signals may be generated by performing phase interpolation between the fourth clock signal (QB) and the first clock signal (I).

In an embodiment, the phase interpolator may include a second multiplexer (MUX) configured to output the first clock signal (I) or the third clock signal (TB) in response to a first control code contained in the phase control code, a third MUX configured to output the second clock signal (Q) or the fourth clock signal (QB) in response to a second control code contained in the phase control code, a plurality of phase controllers, each having a first inverter selected in response to a third control code contained in the phase control code, and a second inverter selected in response to a fourth control code contained in the phase control code, and an amplifier coupled to output terminals of the phase controllers.

In an embodiment, any one of a first inverter and a second inverter included in one of the phase controllers may be provided with a signal, outputted from the second MUX or the third MUX, in response to the third control code and the fourth control code.

In an embodiment, the error detection unit may generate the delay code based on a phase range between 0° and 90° corresponding to the first interpolated clock signals.

In an embodiment, the error detection unit may include code generators configured to accumulate phase shift error values in the first interpolated clock signals, a second decoder configured to change the phase control code in response to phases of the first interpolated clock signals, an encoder configured to select a specific code generator from among the code generators in response to the changed phase control code, a first MUX configured to output the delay code corresponding to a phase shift error value accumulated in the specific code generator in response to the changed phase control code, a multiplier configured to multiply a constant value by the error code, and an adder configured to add the constant value to the delay code outputted from the specific code generator and provide a resulting value to the specific code generator.

In an embodiment, the error code may be set to a positive number (+1) or a negative number (−1).

The delay unit may include a first delay unit configured to delay the reference clock signal, and a second delay unit configured to delay the modulated clock signal.

In an embodiment, the first decoder may control the delay unit so that a rising edge of the reference clock signal is coincident with a rising edge of the modulated clock signal in response to the delay code.

In an embodiment, the TDC may output a negative error code when a phase of the reference clock signal leads that of the modulated clock signal, and outputs a positive error code when the phase of the modulated clock signal leads that of the reference clock signal.

In an embodiment, the digital PLL may further include a loop filter configured to accumulate the error code and generate the digital code in response to accumulated error code.

Further, the present disclosure provides a method of driving a digital phase locked loop (PLL), including generating an output oscillation signal in response to a digital code, generating a first clock signal (I), a second clock signal (Q), a third clock signal (IB), and a fourth clock signal (QB) by dividing a frequency of the output oscillation signal by 2, generating first interpolated clock signals, second interpolated clock signals, third interpolated clock signals, and fourth interpolated clock signals by interpolating phases between the first clock signal (I), the second clock signal (Q), the third clock signal (IB), and the fourth clock signal (QB), outputting the first clock signal (I), the second clock signal (Q), the third clock signal (IB), the fourth clock signal (QB), one of the first interpolated clock signals, one of the second interpolated clock signals, one of the third interpolated clock signals, or one of the fourth interpolated clock signals, as a modulated clock signal, generating a delay code that enables a phase shift error to be compensated for in response to phases of the first interpolated clock signals, and delaying any one of a reference clock signal and the modulated clock signal in response to the delay code.

In an embodiment, the first interpolated clock signals may be generated by performing phase interpolation between the first clock signal (I) and the second clock signal (Q), the second interpolated clock signals may be generated by performing phase interpolation between the second clock signal (Q) and the third clock signal (IB), the third interpolated clock signals may be generated by performing phase interpolation between the third clock signal (TB) and the fourth clock signal (QB), and the fourth interpolated clock signals may be generated by performing phase interpolation between the fourth clock signal (QB) and the first clock signal (I).

In an embodiment, phase shift errors in the first interpolated clock signals, the second interpolated clock signals, the third interpolated clock signals, and the fourth interpolated clock signals may be compensated for in response to the digital code.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
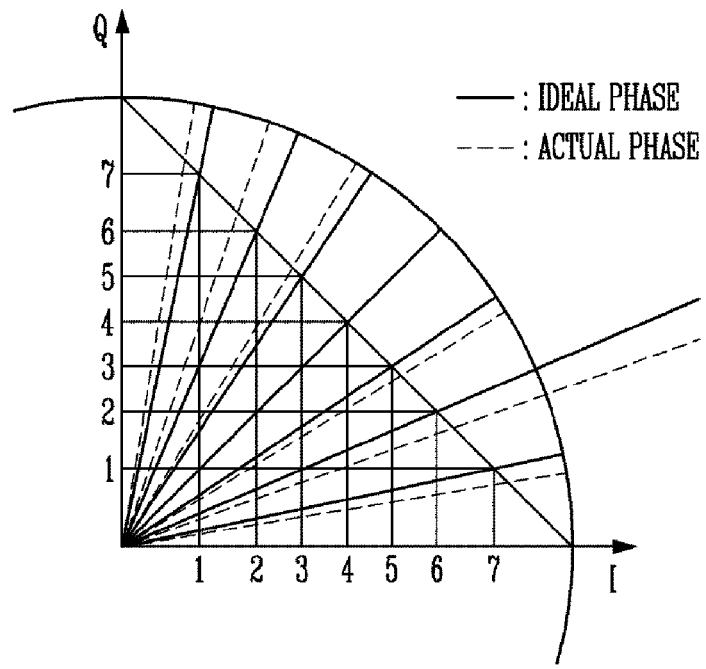
FIG. 1 is a diagram showing the principle of phase interpolation of a digital PLL according to an embodiment of the present disclosure.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram showing the principle of phase interpolation of a digital phase locked loop (PLL) according to an embodiment of the present disclosure.

Referring to FIG. 1, the digital PLL according to the embodiment of the present disclosure may generate a plurality of clock signals having phases between 0° and 90° using a first clock signal I having a phase of 0° and a second clock signal Q having a phase of 90°.

For example, the digital PLL may divide a phase range between 0° and 90° by 11.25° into a plurality of phases. In other words, the digital PLL may generate seven clock signals having different phases between 0° and 90° using phase interpolation.

However, when clock signals are generated using phase interpolation, a phase shift error occurs. For example, as shown in FIG. 1, the clock signals are generated such that they have slight phase errors with respect to ideal phases (desired phases).

Figure 2A:
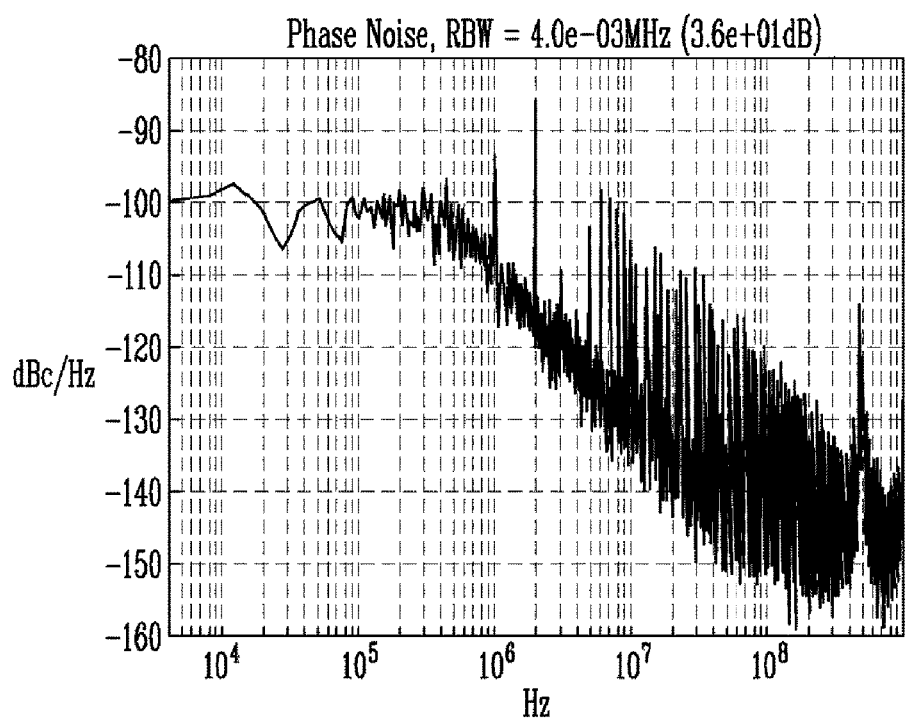
FIGS. 2A and 2B are diagrams showing spurious noise caused by phase interpolation.
Figure 2B:
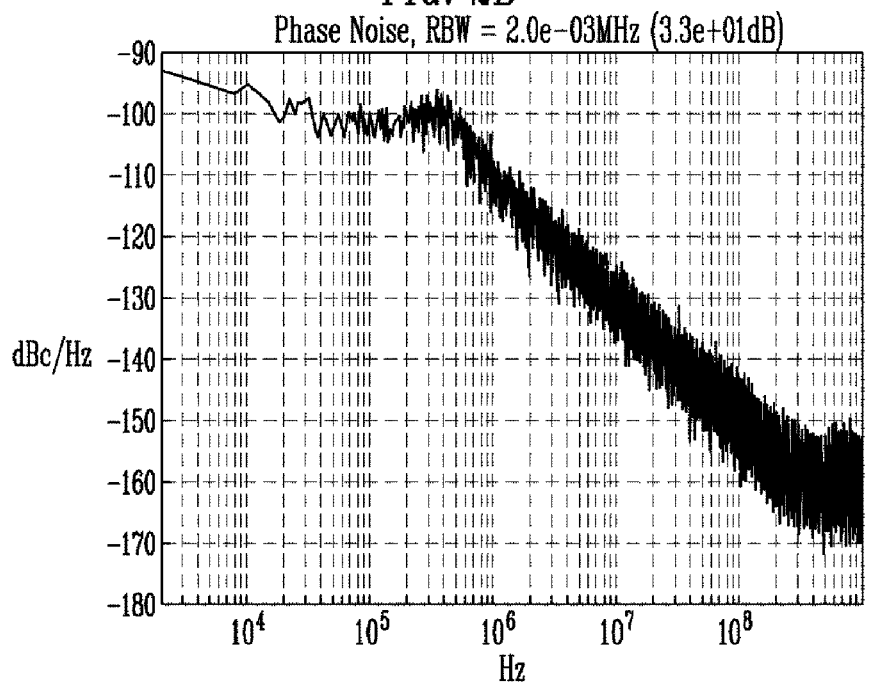

FIGS. 2A and 2B are diagrams showing spurious noise caused by phase interpolation.

FIG. 2A illustrates the case where interpolated clock signals do not have desired phases before errors are not corrected, and FIG. 2B illustrates the case where the interpolated clock signals have desired phases after errors have been corrected.

First, when the phases of interpolated clock signals are not set to desired phases, much spurious noise appears due to phase shift errors, as shown in FIG. 2A. When the digital PLL is used for mobile communication, such spurious noise deteriorates speech quality.

In contrast, when the phases of interpolated clock signals are set to desired phases, spurious noise is minimized, as shown in FIG. 2B. Therefore, the present disclosure controls phase interpolation so that interpolated clock signals have desired phases in order to minimize spurious noise when phases are interpolated using the digital PLL. A detailed description of this operation will be made later.

Figure 3:
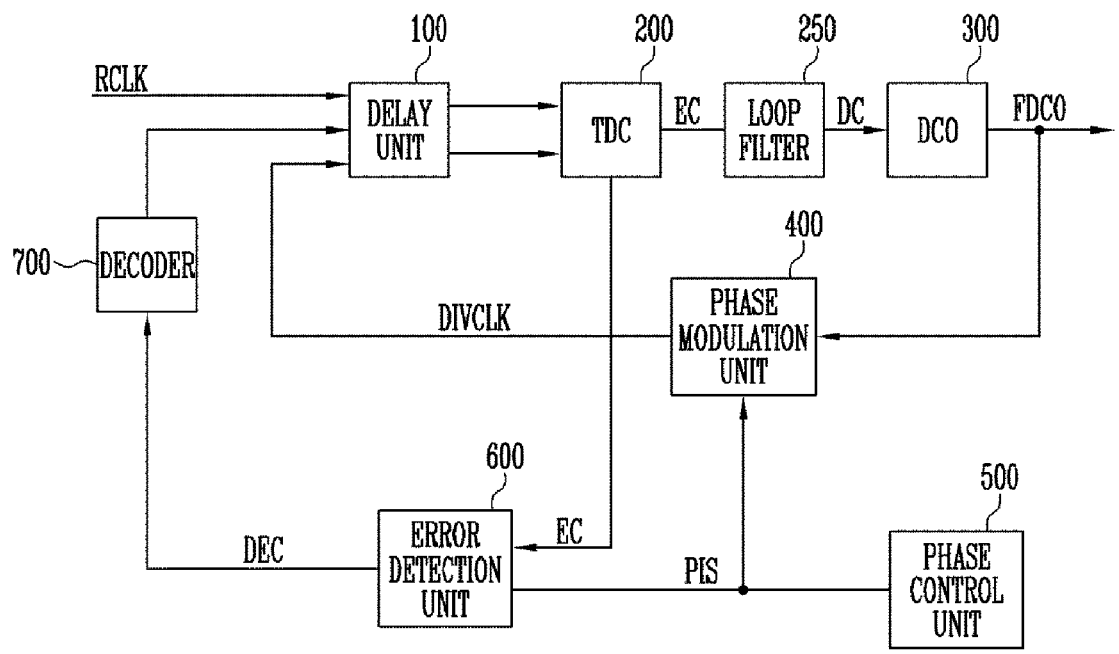
FIG. 3 is a diagram showing a digital PLL according to an embodiment of the present disclosure.

FIG. 3 is a diagram showing a digital PLL according to an embodiment of the present disclosure.

Referring to FIG. 3, the digital PLL according to the embodiment of the present disclosure includes a delay unit 100, a Time to Digital Converter (hereinafter referred to as a "TDC") 200, a loop filter 250, a Digital Controlled Oscillator (hereinafter referred to as a "DCO") 300, a phase modulation unit 400, a phase control unit 500, an error detection unit 600, and a decoder 700.

The DCO 300 varies the frequency and phase of an output oscillation signal FDCO in response to a digital code DC from the loop filter 250. Here, the frequency and phase of the output oscillation signal FDCO may be varied depending on the characteristics and specification of a system in which the digital PLL is installed.

The phase modulation unit 400 controls the phase of the output oscillation signal FDCO in response to a phase control code PIS. For example, the phase modulation unit 400 may generate a plurality of clock signals having phases different from that of the output oscillation signal FDCO using phase interpolation.

More specifically, the phase modulation unit 400 may generate, using the output oscillation signal FDCO, a first clock signal I having a phase of 0°, a second clock signal Q having a phase of 90°, a third clock signal IB having a phase of 180°, and a fourth clock signal QB having a phase of 270°. Further, the phase modulation unit 400 may generate, using phase interpolation, a plurality of first interpolated clock signals having different phases between the first clock signal I and the second clock signal Q, a plurality of second interpolated clock signals having different phases between the second clock signal Q and the third clock signal IB, a plurality of third interpolated clock signals having different phases between the third clock signal IB and the fourth clock signal QB, and a plurality of fourth interpolated clock signals having different phases between the fourth clock signal QB and the first clock signal I.

Thereafter, the phase modulation unit 400 passes the first clock signal I, the second clock signal Q, the third clock signal IB, the fourth clock signal QB, one of the first interpolated clock signals, one of the second interpolated clock signals, one of the third interpolated clock signals, or one of the fourth interpolated clock signals through a second frequency divider in response to the phase control code PIS, and provides the passed clock signal as a modulated clock signal DIVCLK to the delay unit 100.

The delay unit 100 externally receives a reference clock signal RCLK and receives the modulated clock signal DIVCLK from the phase modulation unit 400. Such a delay unit 100 delays the reference clock signal RCLK and/or the modulated clock signal DIVCLK under the control of the decoder 700, and supplies the delayed clock signal to the TDC 200.

The TDC 200 detects a time difference between the reference clock signal RCLK and the modulated clock signal DIVCLK. For example, the TDC 200 detects a time difference between the rising edge of the reference clock signal RCLK and the rising edge of the modulated clock signal DIVCLK, and outputs information about the detected time difference as an error code EC. For this operation, the TDC 200 may be implemented as various types of circuits that are currently known, for example, a Bang-Bang phase detector (hereinafter referred to as a "BBPD"). Further, a simple TDC or a D flip-flop may be added even to a digital PLL model, which does not use the TDC 200, digital PLL, and thus an error code EC may be provided to the error detection unit 600. For example, in the case of a digital PLL implemented using a phase frequency detector instead of the TDC 200, a TDC or a BBPD may be added in parallel with the phase frequency detector, and thus an error code EC may be provided to the error detection unit 600.

The loop filter 250 accumulates the error code EC, and controls the digital code DC in response to the accumulated error code EC. Further, the loop filter 250 may include a gain control unit (not shown) or the like, and may finely control the digital code DC based on the gain. Such a loop filter 250 is configured to generate the digital code DC and may be implemented using various types of circuits that are currently known.

The phase control unit 500 provides the phase control code PIS both to the phase modulation unit 400 and to the error detection unit 600. Such a phase control unit 500 may set the phase control code PIS so that a modulated clock signal DIVCLK having a specific phase is outputted.

The error detection unit 600 generates a delay code DEC using the phase control code PIS and the error code EC. For example, the error detection unit 600 may generate the delay code DEC so that phase shift errors are compensated for. Here, the error detection unit 600 accumulates error information in response to the first interpolated clock signals, the second interpolated clock signals, the third interpolated clock signals, and the fourth interpolated clock signals, and generates the delay code DEC using the accumulated error information.

For example, the error detection unit 600 may generate the delay code DEC corresponding to the first interpolated clock signals in response to the accumulated error code EC. Then, the reference clock signal RCLK or the modulated clock signal DIVCLK is delayed in response to the delay code DEC, and thus the phase shift errors in the first interpolated clock signals may be compensated for.

In addition, the first interpolated clock signals, the second interpolated clock signals, the third interpolated clock signals, and the fourth interpolated clock signals are designated to have a symmetric relationship with respect to axes of 0° and 90°. Therefore, the delay codes DEC of the second interpolated clock signals, the third interpolated clock signals, and the fourth interpolated clock signals are set to the same codes as the delay code of the first interpolated clock signals. Therefore, since the error detection unit 600 may store four identical pieces of error information in a single register, the number of registers in which error codes are to be accumulated and stored may be reduced to ¼.

The decoder 700 (or a first decoder) is provided with the delay code DEC from the error detection unit 600. The error detection unit 600 in which error codes are accumulated controls the delay unit 100 by providing the delay code DEC to the decoder 700 so that a phase shift error in the modulated clock signal DIVCLK may be compensated for. In other words, the decoder 700 controls the delay unit 100 so that the phase shift errors in the first interpolated clock signals, the second interpolated clock signals, the third interpolated clock signals, and the fourth interpolated clock signals may be compensated for using the delay code DEC.

Figure 4:
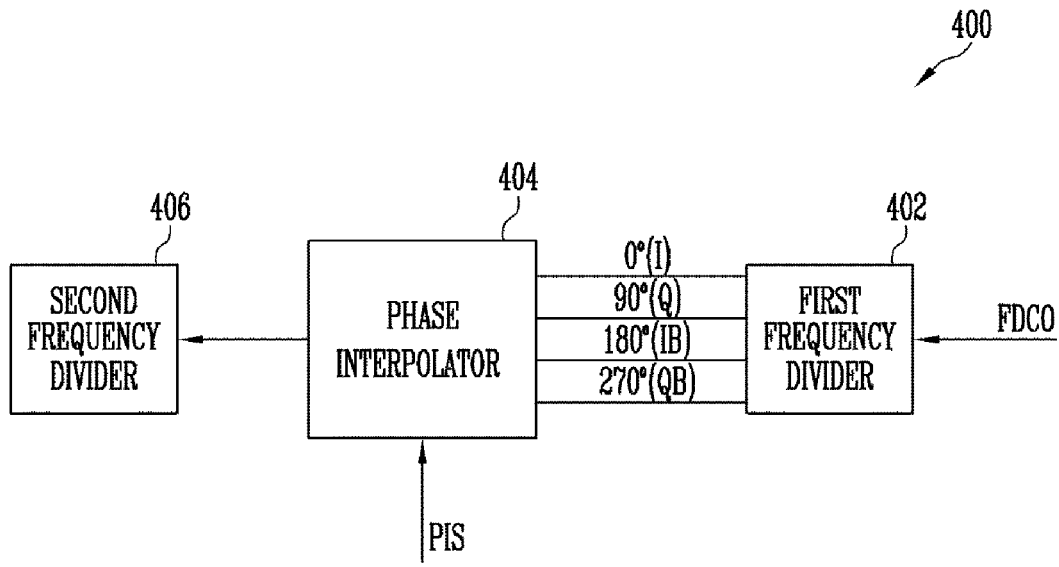
FIG. 4 is a diagram showing an embodiment of a phase modulation unit shown in FIG. 3.

FIG. 4 is a diagram showing an embodiment of the phase modulation unit shown in FIG. 3.

Referring to FIG. 4, the phase modulation unit according to the present disclosure includes a first frequency divider 402, a phase interpolator 404, and a second frequency divider 406.

Figure 5:
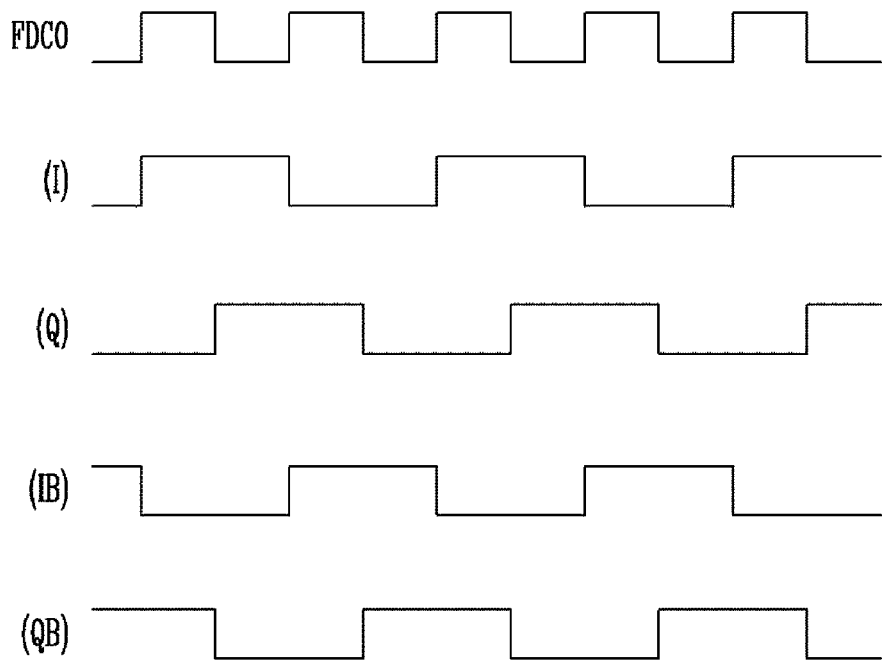
FIG. 5 is a diagram showing clock signals generated by a first frequency divider shown in FIG. 4.

The first frequency divider 402 performs 1/n (n is a natural number) frequency division by dividing the frequency of the output oscillation signal FDCO by n. For example, as shown in FIG. 5, the first frequency divider 402 may generate a first clock signal I having a phase of 0°, a second clock signal Q having a phase of 90°, a third clock signal IB having a phase of 180°, and a fourth clock signal QB having a phase of 270° by dividing the frequency of the output oscillation signal FDCO by 2 (½ frequency division).

The phase interpolator 404 generates first interpolated clock signals, second interpolated clock signals, third interpolated clock signals, and fourth interpolated clock signals using the first clock signal I, the second clock signal Q, the third clock signal IB, and the fourth clock signal QB. For example, the phase interpolator 404 may generate first interpolated clock signals by equally dividing a range between the first clock signal I and the second clock signal Q, that is, a phase range of 90°, into 32 parts. Similarly, the phase interpolator 404 may generate second interpolated clock signals, third interpolated clock signals, and fourth interpolated clock signals by equally dividing ranges between individual clock signals Q, IB, and QB into 32 parts.

Additionally, the phase interpolator 404 outputs the first clock signal I, the second clock signal Q, the third clock signal IB, the fourth clock signal QB, one of the first interpolated clock signals, one of the second interpolated clock signals, one of the third interpolated clock signals, or one of the fourth interpolated clock signals in response to the phase control code PIS. For this operation, the phase control code PIS may be set to a 7-bit code.

The second frequency divider 406 divides the frequency of the clock signal outputted from the phase interpolator 404 by a predetermined ratio, and provides the frequency-divided clock signal as a modulated clock signal DIVCLK to the delay unit 100. For example, the second frequency divider 406 decrease the frequency of the clock signal outputted from the phase interpolator 404 so that the frequency corresponds to the period of the reference clock signal RCLK, and provides the frequency-decreased clock signal as the modulated clock signal DIVCLK to the delay unit 100. The division ratio of the second frequency divider 406 may be controlled in response to a control signal (not shown) that is externally applied.

Figure 6A:
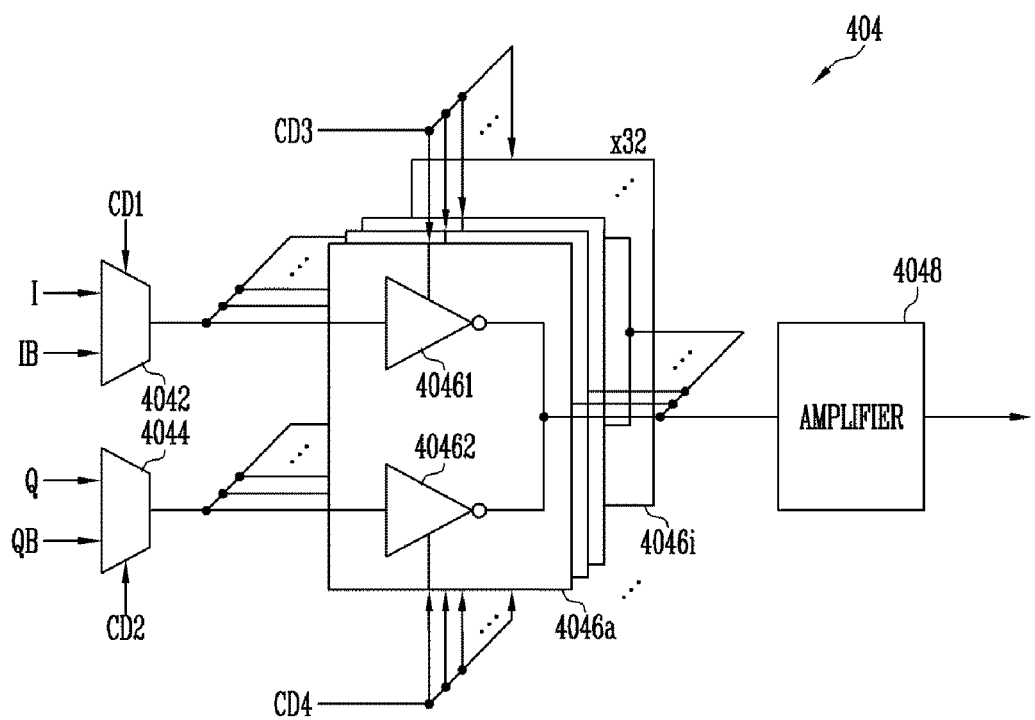
FIG. 6A is a diagram showing a phase interpolator shown in FIG. 4 and FIGS. 6B and 6C are diagrams showing differential nonlinearity and integral nonlinearity, respectively.

FIG. 6A is a diagram showing the phase interpolator shown in FIG. 4. Control codes CD1, CD2, CD3, and CD4 shown in FIG. 6A are contained in a phase control code PIS.

Referring to FIG. 6A, the phase interpolator 404 according to the embodiment of the present disclosure includes a second multiplexer (MUX) 4042, a third MUX 4044, phase controllers 4046a to 4046i (i is a natural number), and an amplifier 4048.

The second MUX 4042 is provided with a first clock signal I and a third clock signal IB. Such a second MUX 4042 outputs the first clock signal I or the third clock signal IB in response to the first control code CD1.

The third MUX 4044 is provided with a second clock signal Q and a fourth clock signal QB. Such a third MUX 4044 outputs the second clock signal Q or the fourth clock signal QB in response to the second control code CD2.

Here, the clock signals (two of I, IB, Q, and QB), outputted from the second MUX 4042 and the third MUX 4044, are set to have a phase difference of 90° therebetween. For example, the second MUX 4042 may output the first clock signal I and the third MUX 4044 may output the second clock signal Q or the fourth clock signal QB. In this case, the phase difference between the first clock signal I and the second clock signal Q is set to 90°, and the phase difference between the first clock signal I and the fourth clock signal QB is set to 90°.

Similarly, the second MUX 4042 may output the third clock signal IB and the third MUX 4044 may output the second clock signal Q or the fourth clock signal QB. In this case, the phase difference between the third clock signal IB and the second clock signal Q is set to 90° and the phase difference between the third clock signal IB and the fourth clock signal QB is set to 90.

The phase controllers 4046a to 4046i perform phase interpolation between the clock signal I or IB, outputted from the second MUX 4042, and the clock signal Q or QB, outputted from the third MUX 4044, and output the interpolated clock signals. For example, the phase controllers 4046a to 4046i may equally divide a phase range of 90° into 32 parts, and the phase interpolator 404 may include 32 phase controllers 4046a to 4046i corresponding to 32 parts.

Each of the phase controllers 4046a to 4046i includes two inverters 40461 and 40462. The first inverter 40461 included in each of the phase controllers 4046a to 4046i is selected in response to the third control code CD3, and the second inverter 40462 therein is selected in response to the fourth control code CD4. Here, the third control code CD3 and the fourth control code CD4 may be set to inverted bits so that only a single inverter 40461 or 40462 is selected from each of the phase controllers 4046a to 4046i.

The amplifier 4048 amplifies the clock signal, outputted from the phase controllers 4046a to 4046i, and provides the amplified clock signal to the second frequency divider 406. For this operation, the amplifier 4048 may include an inverter (not shown) and a resistor (not shown).

The operating procedure of the phase interpolator will be described below. First, the first clock signal I may be outputted from the second MUX 4042 and the second clock signal Q may be outputted from the third MUX 4044 in response to the first control code CD1 and the second control code CD2, respectively.

Further, the first inverter 40461 included in each of the phase controllers 4046a to 4046i may be selected in response to the third control code CD3. In this case, the first clock signal I is outputted from the phase controllers 4046a to 4046i, and the amplifier 4048 amplifies the first clock signal I and provides the amplified clock signal to the second frequency divider 406.

Meanwhile, when the second inverter 40462 included in each of the phase controllers 4046a to 4046i is selected in response to the fourth control code CD4, the second clock signal Q is outputted, and the amplifier 4048 amplifies the second clock signal Q and provides the amplified clock signal to the second frequency divider 406.

Meanwhile, a single first inverter 40461 included in the phase controllers 4046a to 4046i may be selected in response to the third control code CD3, and 31 second inverters 40462 included in the phase controllers 4046a to 4046i may be selected in response to the fourth control code CD4. In this case, a clock signal having a phase difference of about 2.8° from the second clock signal Q is generated, and the generated clock signal is provided to the second frequency divider 406 via the amplifier 4048.

That is, the phase interpolator 404 of the present disclosure may generate clock signals having various phases as the first inverter 40461 and the second inverter 40462, included in each of the phase controllers 4046a to 4046i, are selected. In other words, the phase interpolator 404 equally divides a phase range of 90° into 32 parts, and outputs a clock signal having a specific phase in response to the control codes CD1 to CD4.

In addition, the phases of the clock signals that are phase-interpolated by and outputted from the phase interpolator 404 cannot be set to accurate phases, as indicated by differential nonlinearity (hereinafter referred to as "DNL") and integral nonlinearity (hereinafter referred to as "INL") shown in FIGS. 6B and 6C.

Figure 6B:
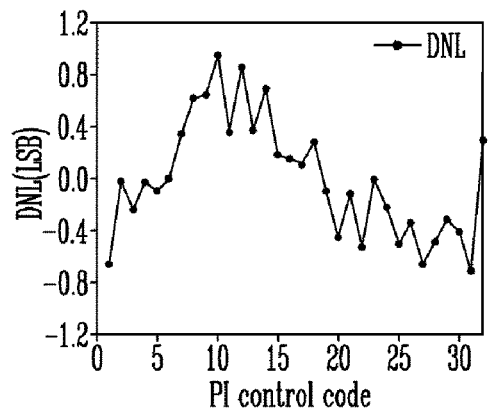
Figure 6C:
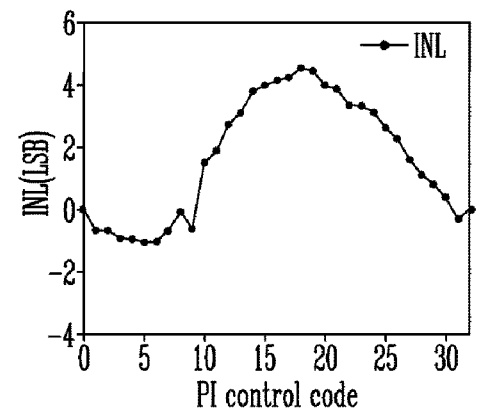

FIGS. 6B and 6C illustrate the DNL and INL of first interpolated clock signals falling within a phase range between 0° and 90°, wherein the second interpolated clock signals to the fourth interpolated clock signals have DNL and INL that are symmetrically identical to those of the first interpolated clock signals with respect to axes of 0° and 90°. That is, the second interpolated clock signals to the fourth interpolated clock signals have the same phase shift error as the first interpolated clock signals.

Figure 7:
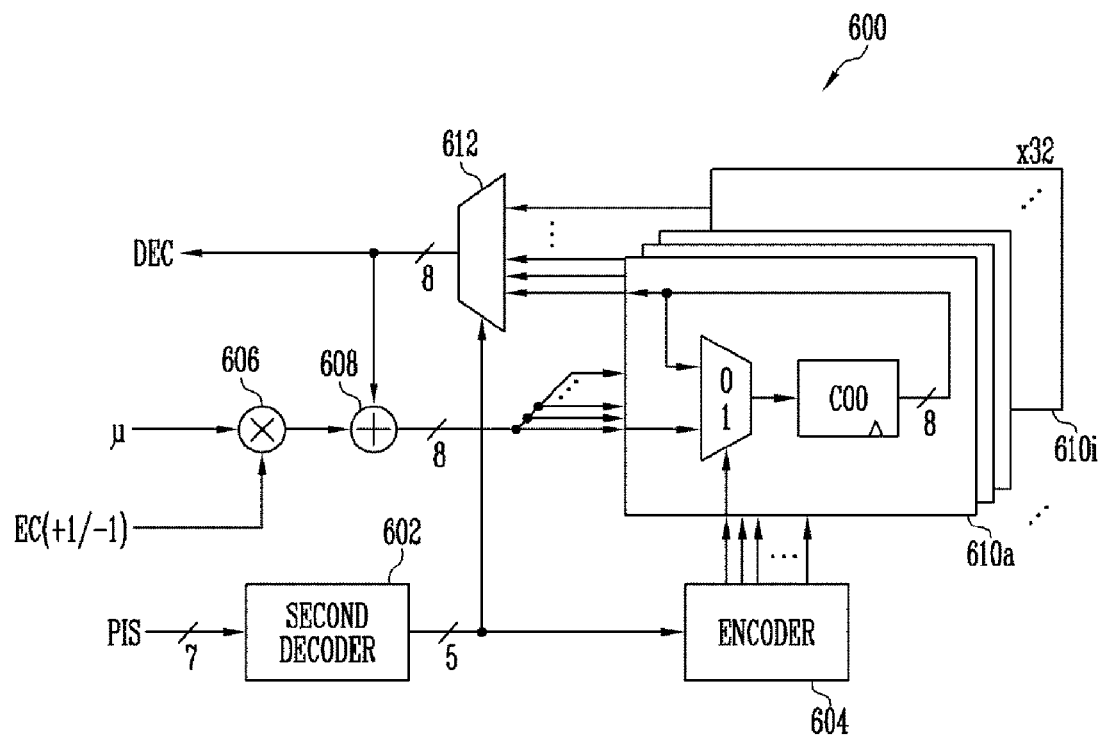
FIG. 7 is a diagram showing an error detection unit according to an embodiment of the present disclosure.

FIG. 7 is a diagram showing the error detection unit according to an embodiment of the present disclosure.

Referring to FIG. 7, the error detection unit 600 according to the embodiment of the present disclosure includes a second decoder 602, an encoder 604, a multiplier 606, an adder 608, a MUX 612, and code generators 610a to 610i.

The code generators 610a to 610i accumulate phase shift error values for phases in a range between the first clock signal I and the second clock signal Q, that is, the phases of the first interpolated clock signals. For this operation, the error detection unit 600 may include 32 code generators 610a to 610i.

The second decoder 602 changes a 7-bit phase control code PIS to a 5-bit phase control code, and provides the 5-bit phase control code to the encoder 604. In other words, the second decoder 602 changes the phase control code PIS to a 5-bit phase control code to correspond to the 32 code generators 610a to 610i, and provides the changed phase control code PIS to the encoder 604.

The encoder 604 selects any one from among the code generators 610a to 610i in response to the 5-bit phase control code PIS. The code generator (one of 610a to 610i) selected by the encoder 604 is coupled to the adder 608.

The MUX 612 (or a first MUX) provides a delay code DEC from any one code generator (one of 610a to 610i), selected from among the code generators 610a to 610i, to the decoder 700 in response to the 5-bit phase control code PIS.

The multiplier 606 multiples a constant value μ by the error code EC outputted from the TDC 200 and provides a resulting value to the adder 608. The error code EC is set to a positive number (+1) or a negative number (−1). The constant value μ is preset and is multiplied by the error code EC, and thus a resulting value is provided as a positive number or a negative number to the adder 608. For example, the constant value μ may be set to 1/1000 and may be provided as a value of 1/1000 or −1/1000 to the adder 608 to the adder 608 depending on the error code EC.

Meanwhile, when the constant value μ is large, the delay code DEC may rapidly converge on a desired value (value causing spurious noise to be minimized), but the accuracy of convergence is low. In contrast, when the constant value μ is small, the delay code DEC converges slowly on a desired value, but the accuracy of convergence is high. Such a constant value μ may be set to any of various values as occasion demands.

The adder 608 adds the positive or negative constant value μ to the delay code DEC outputted from the MUX 612.

The operating procedure of the error correction unit will be described below. First, the 5-bit phase control code PIS from the second decoder 602 is provided to the MUX 612 and to the encoder 604.

The MUX 612, having received the 5-bit phase control code PIS, outputs a delay code DEC from a specific code generator (any one of 610a to 610i). The encoder 604, having received the 5-bit phase control code PIS, electrically connects a specific code generator (any one of 610a to 610i) to the adder 608. Here, the multiplier 606 supplies the positive or negative constant value μ to the adder 608 depending on the error code EC.

Figure 8A:
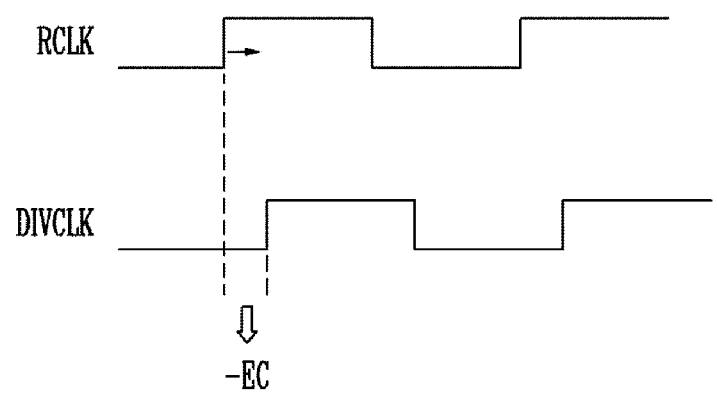
FIGS. 8A and 8B are diagrams showing the principle of generation of an error code.
Figure 8B:
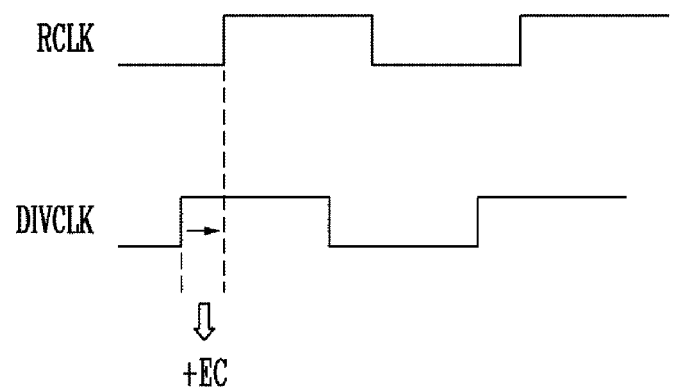

Meanwhile, the error code EC is outputted to correspond to a time difference between the reference clock signal RCLK and the modulated clock signal DIVCLK. For example, the TDC 200 outputs a negative error code −EC when the phase of the reference clock signal RCLK leads that of the modulated clock signal DIVCLK, as shown in FIG. 8A. Further, the TDC 200 outputs a positive error code +EC when the phase of the modulated clock signal DIVCLK leads that of the reference clock signal RCLK, as shown in FIG. 8B.

The adder 608 adds the positive or negative constant value μ to the delay code DEC provided from the MUX 612, and provides a resulting value to a specific code generator (any one of 610a to 610i). When this process is repeated, the delay code DEC, stored (or accumulated) in the specific code generator (any one of 610a to 610i), is set such that the phase shift error thereof may be compensated for.

Figure 9A:
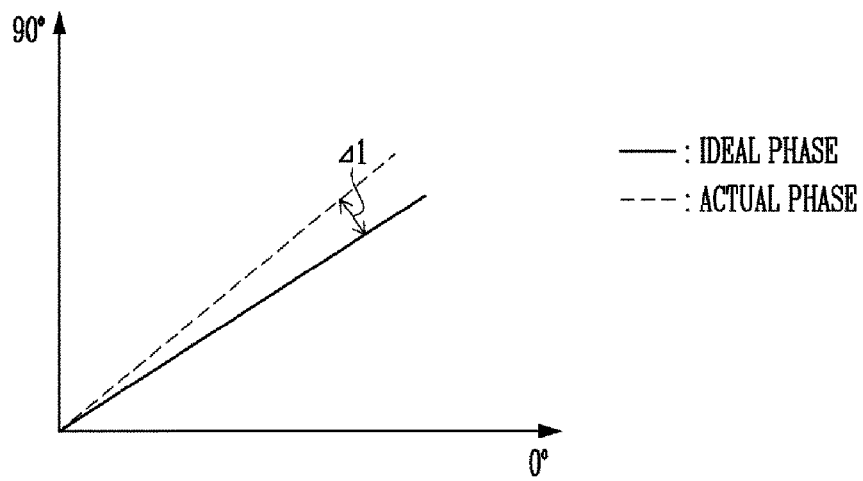
FIGS. 9A to 9C are diagrams showing a procedure for compensating for a phase shift error in response to a delay code.
Figure 9B:
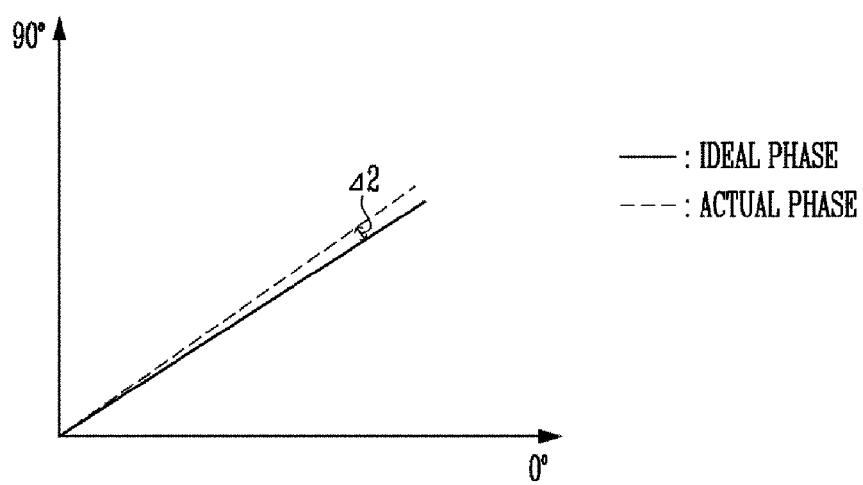
Figure 9C:
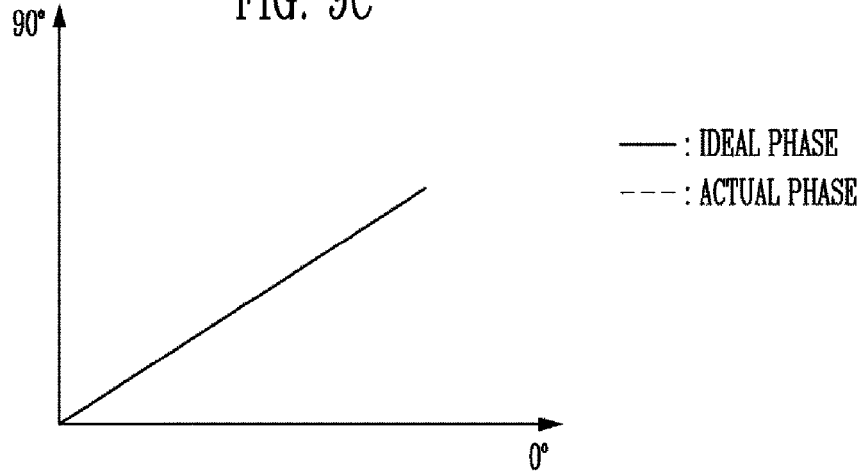

For example, as shown in FIG. 9A, a phase shift error corresponding to a first location (Δ1) from an initial desired phase may occur due to phase interpolation. Here, as the delay code DEC is accumulated, the phase shift error is corrected in the way of (Δ1→Δ2→0), as shown in FIGS. 9B and 9C. Further, in the state in which the phase shift error is corrected, the error code EC is repeated as a negative number and a positive number, and thus the clock signal having a desired phase may be stably generated.

Figure 10:
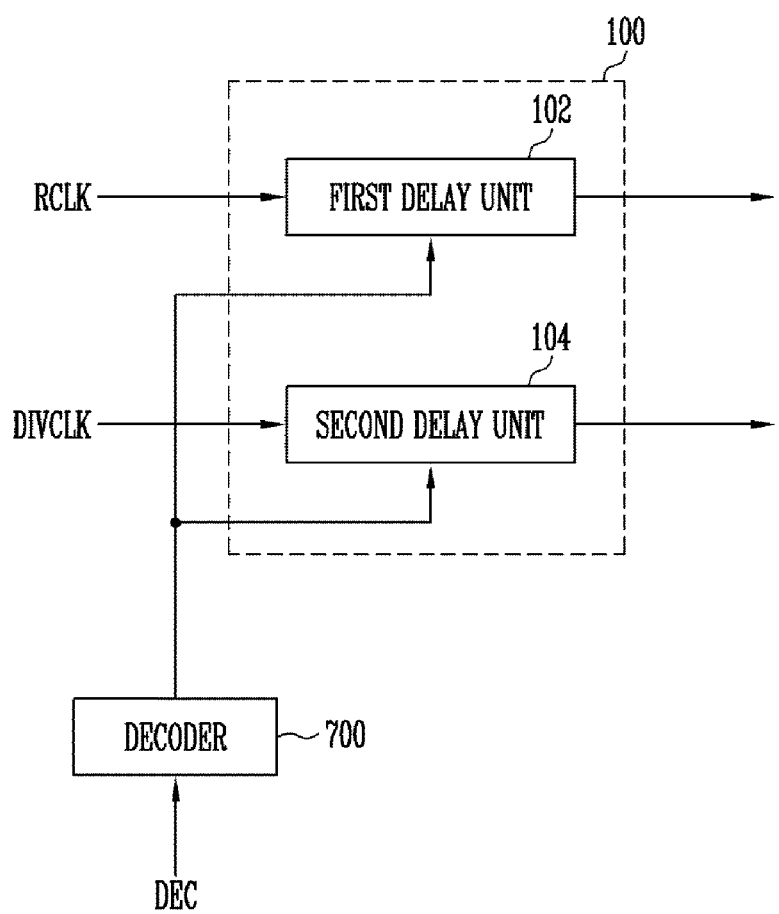
FIG. 10 is a diagram showing an embodiment of a delay unit shown in FIG. 3.

FIG. 10 is a diagram showing an embodiment of the delay unit shown in FIG. 3.

Referring to FIG. 10, the delay unit 100 according to the embodiment of the present disclosure includes a first delay unit 102 and a second delay unit 104.

The first delay unit 102 delays the reference clock signal RCLK under the control of the decoder 700, and supplies the delayed reference clock signal to the TDC 200.

The second delay unit 104 delays the modulated clock signal DIVCLK under the control of the decoder 700 and supplies the delayed modulated clock signal to the TDC 200.

The decoder 700 controls the delay time of the first delay unit 102 and the second delay unit 104 in response to the delay code DEC. For example, when a negative delay code DEC is inputted, the decoder 700 delays the reference clock signal RCLK by controlling the first delay unit 102. Here, the delay time of the reference clock signal RCLK is determined depending on the size of the delay code DEC.

Further, when a positive delay code DEC is inputted, the decoder 700 delays the modulated clock signal DIVCLK by controlling the second delay unit 104. Here, the delay time of the modulated clock signal DIVCLK is determined depending on the size of the delay code DEC.

The operating procedure of the delay unit will be described below. The decoder 700 controls the first delay unit 102 or the second delay unit 104 in response to the delay code DEC. For example, the decoder 700 controls the first delay unit 102 in response to the negative delay code DEC, and thus the reference clock signal RCLK may be delayed and may then be supplied to the TDC 200.

Meanwhile, as the negative delay code DEC is accumulated over time, the value of the negative delay code DEC is increased, and thus the delay time of the first delay unit 102 is also increased. Finally, the rising edge of the reference clock signal RCLK and the rising edge of the modulated clock signal DIVCLK are coincident with each other, and thus spurious noise may be minimized.

In accordance with the embodiments of the digital PLL and the method of driving the digital PLL according to the embodiments of the present disclosure, as error codes are accumulated, error information about some phases is accumulated, and the delay of the reference clock signal and/or the modulated clock signal is controlled based on the accumulated error information. In this case, the interpolated phase may be set to a desired phase, and thus spurious noise may be minimized.

Further, the present disclosure may correct errors in all phases using error information about some phases.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A digital phase locked loop (PLL), comprising:
   a digital controlled oscillator configured to generate an output oscillation signal in response to a digital code;
   a phase modulation unit configured to perform phase interpolation on the output oscillation signal in response to a phase control code from a phase control unit;
   a time to digital converter (TDC) configured to generate an error code using a time difference between a reference clock signal and a modulated clock signal outputted from the phase modulation unit;
   an error detection unit configured to generate a delay code required to compensate for a phase shift error occurring in the phase interpolation in response to the phase control code and the error code;
   a delay unit configured to delay at least one of the reference clock signal and the modulated clock signal and provide a delayed clock signal to the TDC; and
   a first decoder configured to control the delay unit in response to the delay code.

2. The digital PLL according to claim 1, wherein the phase modulation unit comprises:
   a first frequency divider configured to generate, using the output oscillation signal, a first clock signal (I) having a phase of 0°, a second clock signal (Q) having a phase of 90°, a third clock signal (IB) having a phase of 180°, and a fourth clock signal (QB) having a phase of 270°; and
   a phase interpolator configured to generate first interpolated clock signals, second interpolated clock signals, third interpolated clock signals, and fourth interpolated clock signals by performing phase interpolation between the first clock signal (I) to the fourth clock signal (QB).

3. The digital PLL according to claim 2, wherein the phase interpolator outputs the first clock signal (I), the second clock signal (Q), the third clock signal (IB), the fourth clock signal (QB), one of the first interpolated clock signals, one of the second interpolated clock signals, one of the third interpolated clock signals, or one of the fourth interpolated clock signals, as the modulated clock signal, in response to the phase control code.

4. The digital PLL according to claim 2, wherein the phase modulation unit further comprises a second frequency divider disposed between the phase interpolator and the delay unit.

5. The digital PLL according to claim 2, wherein the first frequency divider is a ½ frequency divider.

6. The digital PLL according to claim 2, wherein:
the first interpolated clock signals are generated by performing phase interpolation between the first clock signal (I) and the second clock signal (Q),
the second interpolated clock signals are generated by performing phase interpolation between the second clock signal (Q) and the third clock signal (IB),
the third interpolated clock signals are generated by performing phase interpolation between the third clock signal (IB) and the fourth clock signal (QB), and
the fourth interpolated clock signals are generated by performing phase interpolation between the fourth clock signal (QB) and the first clock signal (I).

7. The digital PLL according to claim 2, wherein the phase interpolator comprises:
a second multiplexer (MUX) configured to output the first clock signal (I) or the third clock signal (IB) in response to a first control code contained in the phase control code;
a third MUX configured to output the second clock signal (Q) or the fourth clock signal (QB) in response to a second control code contained in the phase control code;
a plurality of phase controllers, each having a first inverter selected in response to a third control code contained in the phase control code, and a second inverter selected in response to a fourth control code contained in the phase control code; and
an amplifier coupled to output terminals of the phase controllers.

8. The digital PLL according to claim 7, wherein any one of a first inverter and a second inverter included in one of the phase controllers is provided with a signal, outputted from the second MUX or the third MUX, in response to the third control code and the fourth control code.

9. The digital PLL according to claim 2, wherein the error detection unit generates the delay code based on a phase range between 0° and 90° corresponding to the first interpolated clock signals.

10. The digital PLL according to claim 9, wherein the error detection unit comprises:
code generators configured to accumulate phase shift error values in the first interpolated clock signals;
a second decoder configured to change the phase control code in response to phases of the first interpolated clock signals;
an encoder configured to select a specific code generator from among the code generators in response to the changed phase control code;
a first MUX configured to output the delay code corresponding to a phase shift error value accumulated in the specific code generator in response to the changed phase control code;
a multiplier configured to multiply a constant value by the error code; and an adder configured to add the constant value to the delay code outputted from the specific code generator and provide a resulting value to the specific code generator.

11. The digital PLL according to claim 10, wherein the error code is set to a positive number (+1) or a negative number (−1).

12. The digital PLL according to claim 1, wherein the delay unit comprises:
a first delay unit configured to delay the reference clock signal; and
a second delay unit configured to delay the modulated clock signal.

13. The digital PLL according to claim 1, wherein the first decoder controls the delay unit so that a rising edge of the reference clock signal is coincident with a rising edge of the modulated clock signal in response to the delay code.

14. The digital PLL according to claim 1, wherein the TDC outputs a negative error code when a phase of the reference clock signal leads that of the modulated clock signal, and outputs a positive error code when the phase of the modulated clock signal leads that of the reference clock signal.

15. The digital PLL according to claim 1, further comprising a loop filter configured to accumulate the error code and generate the digital code in response to accumulated error code.

16. A method of driving a digital phase locked loop (PLL), comprising:
generating an output oscillation signal in response to a digital code;
generating a first clock signal (I), a second clock signal (Q), a third clock signal (IB), and a fourth clock signal (QB) by dividing a frequency of the output oscillation signal by 2;
generating first interpolated clock signals, second interpolated clock signals, third interpolated clock signals, and fourth interpolated clock signals by interpolating phases between the first clock signal (I), the second clock signal (Q), the third clock signal (IB), and the fourth clock signal (QB);
outputting the first clock signal (I), the second clock signal (Q), the third clock signal (IB), the fourth clock signal (QB), one of the first interpolated clock signals, one of the second interpolated clock signals, one of the third interpolated clock signals, or one of the fourth interpolated clock signals, as a modulated clock signal;
generating a delay code that enables a phase shift error to be compensated for in response to phases of the first interpolated clock signals; and
delaying any one of a reference clock signal and the modulated clock signal in response to the delay code.

17. The method according to claim 16, wherein:
the first interpolated clock signals are generated by performing phase interpolation between the first clock signal (I) and the second clock signal (Q),
the second interpolated clock signals are generated by performing phase interpolation between the second clock signal (Q) and the third clock signal (IB),
the third interpolated clock signals are generated by performing phase interpolation between the third clock signal (IB) and the fourth clock signal (QB), and
the fourth interpolated clock signals are generated by performing phase interpolation between the fourth clock signal (QB) and the first clock signal (I).

18. The method according to claim 16, wherein phase shift errors in the first interpolated clock signals, the second interpolated clock signals, the third interpolated clock signals, and the fourth interpolated clock signals are compensated for in response to the digital code.

* * * * *